(12) United States Patent
Ghassemi et al.

(10) Patent No.: US 10,121,712 B2
(45) Date of Patent: Nov. 6, 2018

(54) ACCELERATED FAILURE TEST OF COUPLED DEVICE STRUCTURES UNDER DIRECT CURRENT BIAS

(71) Applicants: Hessam Ghassemi, Raleigh, NC (US); Andrew C. Lang, Branchburg, NJ (US); Mitra L. Taheri, Philadelphia, PA (US)

(72) Inventors: Hessam Ghassemi, Raleigh, NC (US); Andrew C. Lang, Branchburg, NJ (US); Mitra L. Taheri, Philadelphia, PA (US)

(73) Assignee: DREXEL UNIVERSITY, Philadelphia, PA (US)

( * ) Notice: Subject to any disclaimer, the term of this patent is extended or adjusted under 35 U.S.C. 154(b) by 0 days.

(21) Appl. No.: 15/087,187

(22) Filed: Mar. 31, 2016

(65) Prior Publication Data

US 2016/0293505 A1    Oct. 6, 2016

Related U.S. Application Data

(60) Provisional application No. 62/143,519, filed on Apr. 6, 2015.

(51) Int. Cl.
*H01L 29/00* (2006.01)
*H01L 21/66* (2006.01)
(Continued)

(52) U.S. Cl.
CPC .......... *H01L 22/32* (2013.01); *G01R 31/2642* (2013.01); *H01L 22/14* (2013.01);
(Continued)

(58) Field of Classification Search
CPC ................ G01R 31/2642; G01R 31/2644
See application file for complete search history.

(56) References Cited

U.S. PATENT DOCUMENTS 4,162,954 A    7/1979  Morrison, Jr.
4,591,418 A    5/1986  Snyder
(Continued)

FOREIGN PATENT DOCUMENTS

EP    1092515 A1    4/2001
EP    1956388 A1    8/2008
(Continued)

OTHER PUBLICATIONS

France, Ryan, et al. "Vanadium-based Ohmic contacts to n-AlGaN in the entire alloy composition." Applied physics letters 90.6 (2007): 62115-62115.

(Continued)

*Primary Examiner* — Mounir Amer
*Assistant Examiner* — Alexander Belousov
(74) *Attorney, Agent, or Firm* — Mendelsohn Duneavy, P.C.

(57) ABSTRACT

A method of conducting an in situ reliability test on a cross-section of a device with layered structure at micron-scale and at least two electrodes. The method includes steps of locating an electron transparent cross-sectional portion of the device in a holder and transmitting a direct current bias voltage to the cross-sectional portion of the device through at least two electrodes of the device, and observing and quantifying the microstructural changes of the device cross-section on the holder. A system for conducting an in situ reliability test on a device with a layered structure at a micron-scale and at least two electrodes is also provided.

19 Claims, 6 Drawing Sheets

(51) Int. Cl.
*G01R 31/26* (2014.01)
*H01L 29/20* (2006.01)
*H01L 29/778* (2006.01)

(52) U.S. Cl.
CPC ...... *G01R 31/2644* (2013.01); *H01L 29/2003* (2013.01); *H01L 29/7786* (2013.01)

(56) References Cited

U.S. PATENT DOCUMENTS

| | | | |
|---|---|---|---|
| 4,591,518 | A | 5/1986 | Snyder |
| 7,411,226 | B2 | 8/2008 | Choug et al. |
| 7,538,718 | B2 | 5/2009 | Ikeda et al. |
| 8,502,323 | B2 | 8/2013 | Chen |
| 9,379,048 | B2 * | 6/2016 | Jones ................ H01L 23/49551 |
| 2006/0244009 | A1 | 11/2006 | Choug et al. |

FOREIGN PATENT DOCUMENTS

| | | |
|---|---|---|
| EP | 2214200 A2 | 8/2010 |
| EP | 1410444 B1 | 8/2012 |

OTHER PUBLICATIONS

Joh, Jungwoo, et al. "A model for the critical voltage for electrical degradation of GaN high electron mobility transistors." Microelectronics reliability 50.6 (2010): 767-773.

Park, S. Y., et al. "Physical degradation of GaN HEMT devices under high drain bias reliability testing." Microelectronics Reliability 49.5 (2009): 478-483.

Makaram, Prashanth, et al. "Evolution of structural defects associated with electrical degradation in AlGaN/GaN high electron mobility transistors." Applied Physics Letters 96.23 (2010): 233509.

* cited by examiner

Figure 7C	Figure 7D

ACCELERATED FAILURE TEST OF COUPLED DEVICE STRUCTURES UNDER DIRECT CURRENT BIAS

RELATED APPLICATION DATA

This application claims priority to U.S. Provisional Application No. 62/143,519, filed Apr. 6, 2015, the entire disclosure of which is hereby incorporated by reference as if set forth fully herein.

STATEMENT OF GOVERNMENTAL INTEREST

This invention was made with government support under Grant No. N000141110114 by the Office of Naval Research. The government has certain rights in the invention.

BACKGROUND OF THE INVENTION

1. Field of the Invention

The present invention is directed to the field of reliability testing of semiconductor devices with layered structures. In particular, the present invention is directed to an in situ reliability test for semiconductor devices with a layered structure under direct current bias.

2. Description of the Related Technology

One common device with a layered structure is a semiconductor transistor, one type of which is a high electron mobility transistor (HEMT). HEMTs are used as signal amplifiers, at microwave and millimeter wave frequencies, in a wide range of applications. HEMTs may be implemented as discrete transistors or in integrated circuits. Microwave monolithic integrated circuits with HEMTs are used in space, military and commercial applications, such as satellite transceivers, global positioning system (GPS)-based navigation systems, broadband wireless networking systems, and radar.

Unlike conventional semiconductor transistors, HEMTs are field effect transistors comprising an electron layer at the interface between two different semiconductor materials having different band gaps. There are multiple types of HEMTs. AlGaAs/GaAs based HEMTs as the most common type. A new type of HEMT is one that is based on an AlGaN/GaN heterostructure. This type of HEMT provides several advantages such as a wide band gap, a superior carrier saturation velocity, thermal conductivity, and a high breakdown field, all of which are useful for high temperature and high speed applications.

Figure 1:
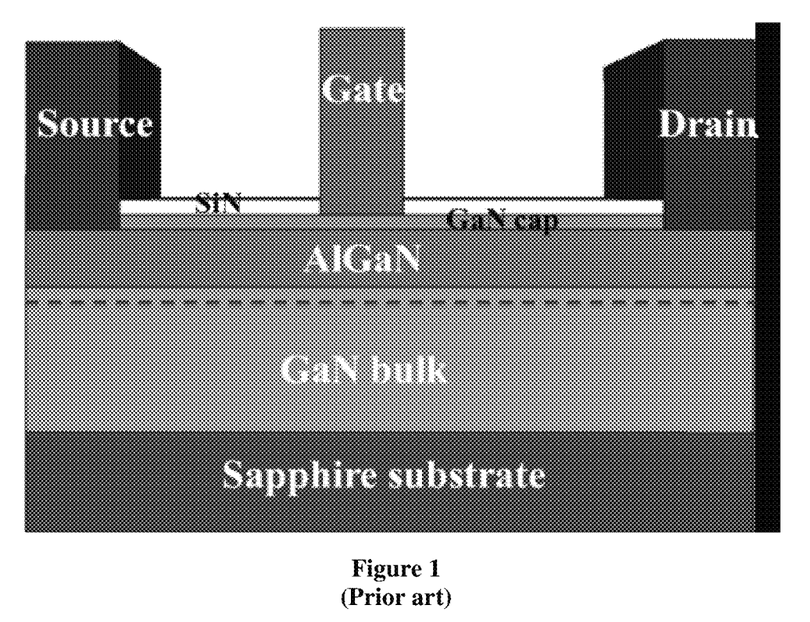
FIG. 1 is a schematic representation of a typical AlGaN/GaN HEMT with two semiconductor layers of AlGaN and GaN.

AlGaN/GaN based HEMTs can be operated at high voltages, of up to 42 volts, through three electrodes: source, gate and drain. The ability of HEMTs to function at higher voltages reduces power consumption and decreases their reliance on a cooling system. Consequently, AlGaN/GaN based HEMTs can reduce the operational costs of high power microwave transmitters, especially since maintaining a cooling system may contribute a significant fraction of the operational cost of many of these applications. A schematic diagram of a typical AlGaN/GaN based HEMT is shown in FIG. 1. The dotted line represents a two-dimensional electron gas (2DEG) interfacial region in Ga-polar HEMTs, which is between the AlGaN and GaN layers.

Even with their many advantages, AlGaN/GaN based HEMTs have a tendency to fail when high voltages are supplied to the HEMTs under certain stressful operational conditions. Failure modes of AlGaN/GaN based HEMTs are not well understood, though it is believed that an inverse piezoelectric effect may be a mechanism that causes failures in these HEMTs. Particularly, when AlGaN/GaN based HEMTs are operated at a high voltage, a large electric field is generated under the drain edge of the gate, which results in localized mechanical stresses concentrated in the AlGaN barrier. These high stresses are graphically illustrated in FIG. 2 by the arrows.

Figure 2:
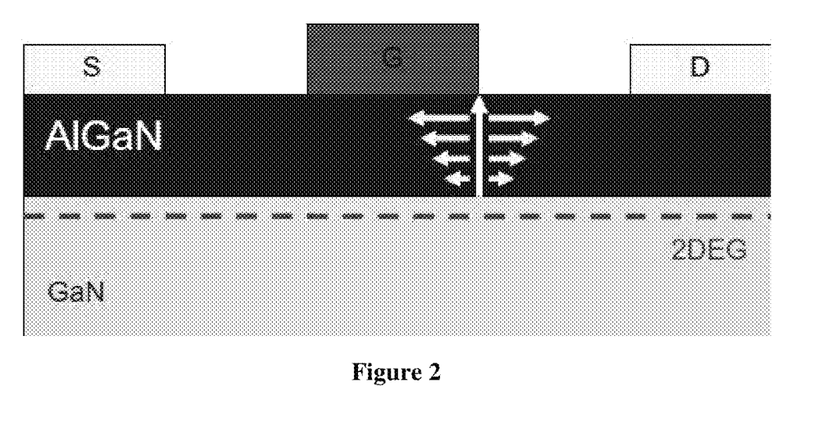
FIG. 2 is a diagram showing localized tensile strain under the gate region in AlGaN layer of an AlGaN/GaN HEMT.

FIG. 2 further shows a two-dimensional electron gas (2DEG), a high mobility electron layer formed below the junction of AlGaN layer and a GaN layer. Additionally, due to their lattice mismatch, the AlGaN/GaN interface is already under substantial tensile strain at a "rest" state, or when it is not under an applied voltage. When under electrical stress, the elastic energy in this high-field gate edge region causes added strain. Defects act as pathways for gate leakage currents, which results in electron trapping and degradation of the transport properties of the electron channel underneath.

Currently, a common approach to study failures of HEMTs is by observing their surface morphology with surface imaging techniques, such as by use of cathodoluminescence spectroscopy, atomic force microscopy, or transmission electron microscopy. For example, Makaram et al. in an article entitled "Evolution of structural defects associated with electrical degradation in AlGaN/GaN high electron mobility transistors,"*Applied Physics Letters*, vol. 96, 233509-1 to 233509-3, (2010), discusses an investigation of surface morphology of electrically stressed AlGaN/GaN HEMTs using atomic force microscopy and scanning electron microscopy. Before imaging, the stressed HEMTs were subjected to several time-consuming preparation steps, including removing the SiN passivation layer by chemical etching; removing contact and gate metals using aqua regia (3:1 $HCl:HNO_3$) at 80° C. for 20 minutes; and cleaning the surface using piranha solution ($H_2SO_4:H_2O$) for 5 minutes at 15° C. Also, these imaging based techniques only reveal surface morphology, but not the internal microstructural changes of the HEMTs.

U.S. Pat. No. 7,411,226 ("the '226 patent") discusses a high electron mobility transistor structure with a gate metal stack including an additional thin layer of a refractory metal (such as molybdenum or platinum) at a junction between the gate metal stack and a Schottky barrier layer. The refractory metal layer reduces or eliminates long-term degradation of the Schottky junction between the gate metal and the barrier layer, thereby improving the long-term reliability of the devices. In addition, the '226 patent discusses a method for assessing the reliability of the HEMTs using elevated temperature life tests. Comprehensive direct current (DC) and radio frequency measurements are taken for discrete devices before and after the elevated temperature life test. In addition, before, during and after the high temperature life test, cross-sections of the HEMT are prepared using a focused ion beam (FIB). The cross-sections are studied by scanning transmission electron microscope using an energy dispersive X-ray for compositional and depth-profile (structural) analysis.

Park et al. in the article "Physical degradation of GaN HEMT devices under high drain bias reliability testing," *Microelectronics Reliability*, vol. 49, pages 478-483, (2009) discusses AlGaN/GaN HEMTs that are epitaxially grown on semi-insulating SiC substrates. The reliability of the HEMTs is evaluated using an accelerated DC life test. In this test, the HEMT is subjected to elevated temperatures and variations in drain current and gate current are recorded during the tests. A focused ion beam is then used to lift out a cross-section from the HEMTs for studying the internal structural changes of the HEMT after the stress tests. Multiple cross-sections may be prepared from a single HEMT to study different regions of the HEMT. The structural changes in the HEMTs are observed by cross-sectional high resolution TEM (HRTEM) and high angle dark field imaging.

U.S. Pat. No. 7,538,718 ("the '718 patent") discusses a failure detection procedure used for HEMTs. The procedure uses a control circuit to control a gate voltage switch for applying various gate voltages to an HEMT. The control circuit measures values of the drain current flow after the gate voltage is applied and thereby detects a failure of the transistor based on the current values. However, the '718 patent does not discuss observing the internal microstructure of the HEMT.

The HEMT reliability tests discussed above focus on either the surface morphology or internal structure of the HEMT via ex situ TEM. These tests do not properly correlate dislocation nucleation and cluster of point defects behaviors with electrical property degradation. One of the aspects of the present invention is an improved reliability test for HEMTs carried out by subjecting the HEMT to DC bias voltages and observing the microstructural changes in the HEMT by using in situ TEM. This reliability test may also be applicable to other devices with layered structures.

SUMMARY OF THE INVENTION

One aspect of the present invention may be a method of conducting an in situ reliability test on an electron transparent cross-sectional portion of a device having a layered structure and at least two electrodes. The method may include the steps of locating the cross-sectional portion of the device in a holder capable of transmitting a direct current voltage to the cross-sectional portion. The cross-sectional portion of the device includes at least a portion of the at least two electrodes of the device. A direct current voltage is then transmitted from the holder onto the cross-sectional portion through the at least two electrodes and the microstructure of the cross-sectional portion is imaged using a transmission electron microscope.

Another aspect of the present invention may be a method further comprising a step of thinning the device cross-section to render it electron transparent.

Still yet another aspect of the present invention may be a method further comprising a step of coating the cross-section of the device with a coating comprising a metal oxide, metal hydroxide, or combination of two.

Another aspect of the present invention may be a method further comprising the step of electrically connecting the holder to the electrodes of the cross-section of the device an electrically conductive epoxy for transmitting direct current voltages to the device cross-section to form an electrical circuit including the device cross-section.

Still yet another aspect of the present invention may be a method further comprising steps for preparing the cross-section of the device including depositing a protection layer on a surface on the device where the electrodes of the device are located; drilling holes through the protection layer to access each of the electrodes; depositing a conductive material in the drilled holes to form protruding outreach electrodes for the device; and removing a cross-sectional portion from the device to obtain a device cross-section from an area of interest in the device.

Yet another aspect of the present invention may be a system for conducting an in situ reliability test on a device with a layered structure and at least two electrodes, the system comprising at least an electron transparent cross-sectional portion of the device including at least a portion of the at least two electrodes of the device and a holder for holding the cross-section and transmitting a direct current voltage to the held cross-sectional portion of the device.

DETAILED DESCRIPTION OF THE PREFERRED EMBODIMENT(S)

For illustrative purposes, the principles of the present disclosure are described by referencing various exemplary embodiments. Although certain embodiments are specifically described herein, one of ordinary skill in the art will readily recognize that the same principles are equally applicable to, and can be employed in other systems and methods.

Before explaining the disclosed embodiments of the present disclosure in detail, it is to be understood that the disclosure is not limited in its application to the details of any particular embodiment shown. Additionally, the terminology used herein is for the purpose of description and not of limitation. Furthermore, although certain methods are described with reference to steps that are presented herein in a certain order, in many instances, these steps may be performed in any order as may be appreciated by one skilled in the art; the novel method is therefore not limited to the particular arrangement of steps disclosed herein.

It must be noted that as used herein and in the appended claims, the singular forms "a", "an", and "the" include plural references unless the context clearly dictates otherwise. Furthermore, the terms "a" (or "an"), "one or more" and "at least one" can be used interchangeably herein. The terms "comprising", "including", "having" and "constructed from" can also be used interchangeably.

The present invention provides a testing method for evaluating the reliability of a device. The method of the present invention may be applicable to any device with a layered structure at the micron scale. The device also has electrodes for supplying direct current bias voltage to the device to induce stress in the device. Examples of devices that can be tested by the method of the present invention include semiconductor transistors, such as high electron mobility transistors (HEMTs), and nanoelectronic semiconductors. The HEMTs are used as an illustrative example in the description of this patent application to describe the details of the method of the present invention. However, a person skilled in the art will appreciate that the method of the present invention may be modified from the exemplary embodiments described herein for reliability testing of other types of devices.

Figure 4A:
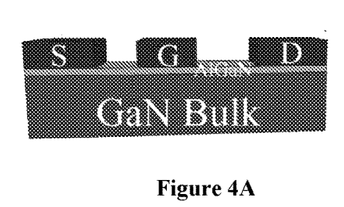
FIG. 4A is a cross-sectional view of an AlGaN/GaN HEMT showing the semiconductor layers and three electrodes.

Referring to FIG. 4A, an HEMT based on an AlGaN/GaN heterostructure is shown with three electrodes (S, G, and D) located on the top surface of the HEMT. Similarly, other types of HEMTs (such as these with N-$Al_xGa_{1-x}As$/GaAs or AlGaAs/GaAs heterostructures) may also have three electrodes on one surface. HEMTs are based on a heterostructure which consists of at least two different semiconducting materials brought into intimate contact. Because of the different band gaps and their relative alignment to each other, band discontinuities occur at the junction between the two semiconducting material layers. There is a layer of high electron mobility, formed below the junction that is called a 2DEG (two-dimensional electron gas). The 2DEG functions as the true electron channel of the transistor.

The reliability testing method of the present invention uses a holder to receive a thin cross-section of the HEMT device and subjects the device cross-section to a direct current (DC) bias voltage via the electrodes of the device cross-section. The DC bias voltage is sufficiently high to induce stress and microstructural changes in the device cross-section. The DC bias voltage is transmitted to the cross-section to induce stress in the cross-section in order to simulate stress that may occur under typical operating conditions of an HEMT device.

After application of the DC bias voltage, the holder with the device cross-section is placed in a transmission electron microscope (TEM) for observing the microstructural changes induced by the DC bias voltage. The microstructural changes in the device cross-section are indicators of the reliability of the device under typical operating conditions. Since the application of DC bias voltage and the TEM observation are performed while the device cross-section is at the same location, i.e., on the holder, this method is an in situ reliability testing method. One advantage of an in situ reliability testing method is that since the device cross-section need not be manipulated to be viewed in the TEM after application of DC bias voltage, the testing method is able to isolate the effects of the DC bias voltage. In many other test methods this is not possible since the sample must be lifted out of a substrate after application of stress for viewing and changes can be induced in the sample during the lifting out process.

The holder used in the present invention is an apparatus for providing support for the device cross-section. In addition, the holder is capable of transmitting a DC bias voltage to the device cross-section through the electrodes of the device cross-section to form an electrical circuit including the device cross-section. The DC bias voltage passed through this electrical circuit induces stress conditions in the device cross-section that can accelerate failure mechanisms of the device. Another advantage of the present method is that it permits observation of microstructural changes in the device cross-section as it is stressed by the DC bias voltage. As a result, the microstructural changes induced by the DC bias voltage may be observed in real time.

Figure 3:
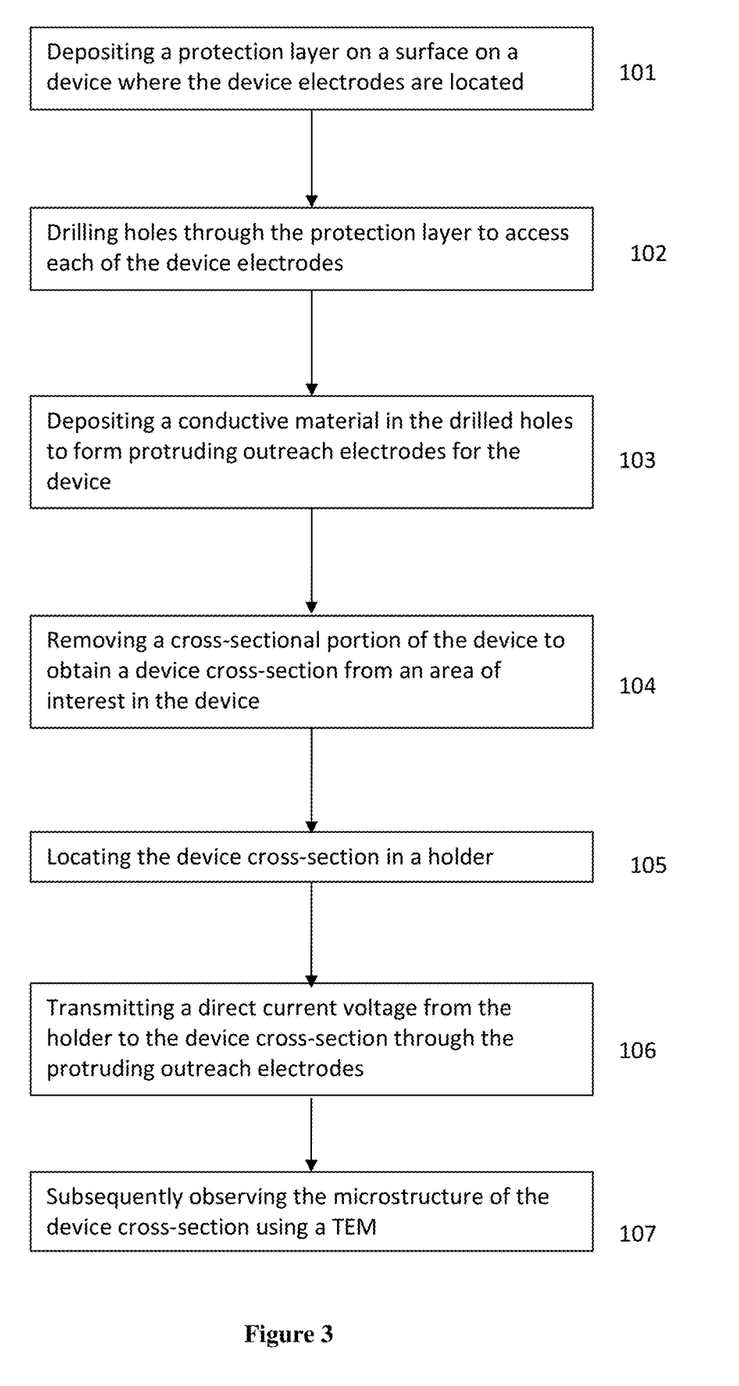
FIG. 3 is a flow chart showing an in situ reliability test method according to one embodiment of the present invention.

FIG. 3 is a flow chart showing the in situ reliability test method in accordance with an embodiment of the present invention. In step 101, the in situ reliability test method comprises depositing a protection layer on a surface of a device where the electrodes of the device are located. In step 102 holes are drilled through the protection layer to access each of the electrodes. In step 103 a conductive material is deposited in the drilled holes to form protruding outreach electrodes for the device. In step 104 a thin cross-section is cut out of the device to obtain a device cross-section from an area of interest in the device. In step 105 the holder receives the device cross-section. The holder is configured for transmitting a DC bias voltage to the protruding outreach electrodes of the device cross-section. In step 106, a DC bias voltage is transmitted from the holder to the device cross-section through the protruding outreach electrodes. In step 107, the microstructure of the cross-section is imaged on the holder using a TEM and the microstructural changes of the cross-sectional portion of the device are observed and quantified.

Referring to FIG. 3, the in situ reliability test method may comprise depositing a protection layer on a surface on the device where the electrodes of the device are located. The protection layer is used to cover the electrodes of the device. In particular, this protection layer is for preventing a short circuit between the electrodes of the device during the reliability test. Thus, the protection layer is not electrically conductive. The protection layer can also reduce or prevent damage to the electrodes of the device from physical contact during handling of the device to set up the testing process.

Figure 4B:
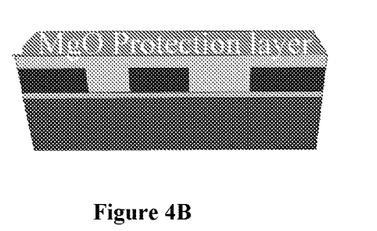
FIG. 4B is a diagram of the AlGaN/GaN HEMT of FIG. 4A with an MgO protection layer deposited on the surface with the three electrodes.

Referring to FIG. 4B, in one embodiment, the method deposits a protection layer on a surface of the HEMT where the three HEMT electrodes (S, D, and G) are located. The protection layer covers the three electrodes of the HEMT with a non-conductive material.

The protection layer may comprise one or more metal oxides and/or one or more metal hydroxides selected from oxides or hydroxides of silicon (such as silicon oxide, silicon oxide hydrate), aluminum (such as aluminum oxide, aluminum oxide hydrate), zirconium (such as ((hydrated) zirconium dioxide), magnesium (such as magnesium oxide, magnesium hydroxide), calcium, iron (III), yttrium, cerium, zinc and combinations thereof.

The protection layer may have a thickness of from 200 nm to about 1000 nm, or from about 300 nm to about 800 nm, or from about 350 nm to about 700 nm, or from 400 nm to about 600 nm.

The protection layer may be deposited on the device surface by a vapor deposition method such as physical vapor deposition or chemical vapor deposition. Suitable physical vapor deposition methods include reactive sputtering evaporation and reactive cathodic arc evaporation. Reactive sputtering and reactive cathodic arc evaporation are generally similar to ordinary sputtering and cathodic arc evaporation except that a reactive gas is introduced into the vapor deposition chamber to react with the vaporized material. Sputtering evaporation and cathodic arc evaporation techniques are known to persons skilled in the art. Sputtering evaporation techniques and equipment are discussed in J. Vossen and W. Kern "Thin Film Processes II", Academic Press, 1991; R. Boxman et al, "Handbook of Vacuum Arc science and Technology", Noyes Pub., 1995; and U.S. Pat. Nos. 4,162,954 and 4,591,418, all of which are incorporated herein by reference in their entirety.

Reactive sputtering evaporation deposition utilizes a refractory metal (such as magnesium or zirconium) as the cathode, and a receiving surface placed in a chamber filled with a reactive gas such as oxygen. The air in the chamber is first evacuated to produce vacuum conditions in the chamber. The reactive gas is then introduced into the evacuated chamber. The gas particles are ionized and accelerated to the cathode to dislodge metal atoms. The dislodged metal atoms, after reaction with the reactive gas, are then deposited as a protective oxide or hydroxide layer on the surface of the device. In one embodiment, to produce a protection layer comprised of MgO, the cathode is comprised of Mg, and oxygen is the reactive gas introduced into the vacuum chamber.

In reactive cathodic arc evaporation deposition, a metal cathode and a reactive gas (such as oxygen) are introduced into an evaporation chamber. An electric arc of typically several hundred amperes is struck on the surface of a metal cathode such as magnesium or titanium. The arc vaporizes the cathode material, which then reacts with a reactive gas (such as oxygen) and deposits on the surface of the device to form a protection layer.

Chemical vapor deposition is a process where all reactants are introduced into a reactor chamber in a vapor state, and the energy necessary for bond cleavage is supplied either by thermal energy, or by electronic energy in a plasma, or both. The film deposition is preferably tightly controlled by adjusting the flows of metal, source precursor and reactive gas into the reactor chamber. The reaction product is deposited on the surface of the device to form the protection layer.

Referring to FIG. 3, the in situ reliability test method may comprise as step of drilling holes through the protection layer to access the electrodes of the device. Any techniques known to a person skilled in the art that are capable of drilling holes through the protection layer without damaging the underlying device structure may be used for the present invention. Suitable drilling techniques include manual drilling and laser drilling. Laser drilling techniques comprise the removal of at least a portion of the material of the protection layer using a laser to form the holes and may involve ablating at least a portion of the protection layer material disposed on the device surface.

Figure 4C:
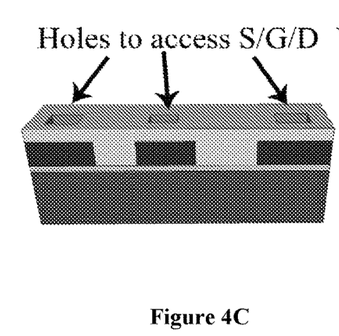
FIG. 4C is a diagram of the AlGaN/GaN HEMT of FIG. 4B with three holes drilled through the MgO protection layer to access the three electrodes.

Referring to FIG. 4C, in one embodiment where the HEMT has three electrodes (S, G, and D) on the top surface, three holes are drilled through the protection layer to access the three electrodes of the HEMT. The step of drilling may be performed from directly above the three electrodes thus forming three holes running through the protection layer and exposing the three HEMT electrodes. In one exemplary embodiment, the drilled holes do not reach any part of the HEMT surface beyond the three electrodes, thereby preventing damage to the HEMT as a result of the drilling process.

In some embodiments, the drilled holes may be substantially rectangular, square, or rounded in shape. In an exemplary embodiment, the size of the holes is smaller than the size of the electrodes underneath. The drilled holes may have a substantially conical shape, with a smaller diameter closer to the bottom of the drilled holes, and a larger diameter closer the top of the drilled holes.

Figure 4D:
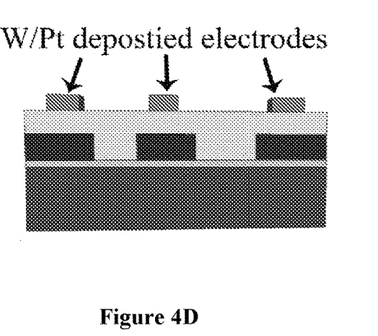
FIG. 4D is a diagram of the AlGaN/GaN HEMT of FIG. 4C with W/Pt deposited in the three drilled holes to form protruded outreach electrodes.

Referring to FIG. 3, the in situ reliability test method may comprise a depositing step 103. In depositing step 103 a conductive material is deposited in the drilled holes to form protruding outreach electrodes. Such protruding outreach electrodes are electrically connected to the device electrodes and act as an extension of the device electrodes through the protection layer for connection to a source of DC bias voltage when the cross-sectional portion of the device is located in the holder. In one embodiment, the protruding outreach electrodes project above the surface of the protection layer as shown in FIG. 4D. In this embodiment, W/Pt is deposited in the drilled holes to form three protruding outreach electrodes that both electronically connect with the three electrodes of the HEMT and protrude above the protection layer, thereby providing electrical access to the three electrodes of the HEMT from outside of the protection layer.

The protruding outreach electrodes may be taller than the protection layer surface and may have a height of, for example, from about 200 nm to about 800 nm, or from about 300 nm to about 700 nm, or from about 300 nm to about 600 nm, or from about 400 nm to about 600 nm. The conductive material used to make the protruding outreach electrodes may be a metal selected from the group consisting of Sn, Y, Ho, Pb, Bi, Li, Al, Ga, Sb, Si, Cd, Mg, Co, Ni, Zr, Hf, Sc, Yb, Lu, Fe, Nb, Ta, W, Te, Au, Pt, and combinations thereof. In one embodiment, the conductive material is Pt, W, or a combination of the two.

One technique for depositing the conductive material in the drilled holes is by introducing the conductive material into the drilled holes in solid form, such as a powder or thin wires, and then melting the conductive material to completely fill the drilled holes with conductive material. The heat source used for melting the conductive material may be a laser, such as a $CO_2$ laser, a Nd:YAG laser, or a UV laser, an electron beam, a particle beam (e.g. an ion beam), or an electric arc. The molten conductive material in the holes is then cooled to solidify and form the protruding outreach electrodes. Several laser and electron beam heating methods suitable for the above technique are well-known to a person skilled in the art, such as Selective Laser Sintering (SLS), Selective Electron Beam Melting (SEBM), Laser Cuising and Selective Laser Melting.

Another technique for depositing the conductive material in the drilled holes involves introducing the conductive material into the drilled holes in molten form. This technique involves injecting a liquid conductive material into the drilled holes and cooling the conductive material to solidify and form the protruding outreach electrodes.

A third technique for depositing the conductive material in the drilled holes involves placing a wire of conductive material in or above a drilled hole and heating the wire to melt the conductive material which falls into and fills the drilled hole. Laser beam FIB and electron beam may be used to melt a conductive material wire.

Figures 5A, 5B, 5C:
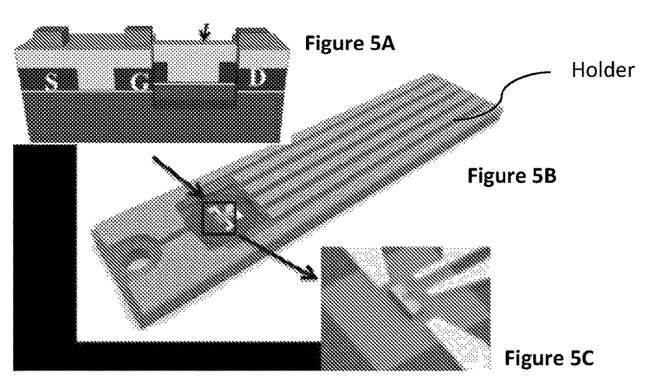
FIG. 5A is a diagram of the AlGaN/GaN HEMT of FIG. 4D showing a cross-section including the G, S and D electrodes being lifted-out.
FIG. 5B is a diagram of the HEMT cross-section prepared in FIG. 5A being placed on a biasing holder, wherein the box is the location where the HEMT cross-section is placed.
FIG. 5C is a diagram showing the biasing holder of FIG. 5B with the HEMT cross-section placed in a TEM holder to be observed using the TEM, wherein the object in the center of FIG. 5C is the biasing holder.

Referring to FIG. 3, the in situ reliability test method may comprise a removing step 104. Removal of a cross-sectional portion of the device may be carried out by cutting out a cross-section of the HEMT device to obtain a cross-sectional portion from an area of interest. The cross-sectional portion is a thin layer comprising portions of at least two electrodes from the HEMT device. The portions of the electrodes are used for supplying DC bias voltage to the cross-sectional portion of the device during the test procedure. The cross-sectional portion preferably comprises the layer structure in the device for best simulating the behavior of the device since often observation of the behavior of the interface between device layers is important for evaluating device reliability. In one embodiment, the device is an HEMT and the device cross-section includes the drain and gate electrodes and two semiconductor layers as shown in FIG. 5A.

In some embodiments the removing step 104 is performed using a conventional focused ion beam (FIB) to cut the cross-section from the device. FIB uses a finely focused beam of gallium ions operated at high beam currents for site specific sputtering or milling of a structure with high accuracy. The FIB technique is described in more detail in European Patent publication nos.: EP 1 092 515 and EP 2 214 200, which are incorporated herein by reference in their entirety.

In some embodiments, laser-based cutting techniques are used to cut the device to obtain the cross-sectional portion. In an exemplary embodiment, one of two laser based techniques may be used: laser evaporation cutting and laser melt ejection cutting. Both techniques involve impinging a pulsed laser beam onto a device surface to form a score.

In laser evaporation cutting, a pulsed laser beam having a very high intensity (power densities over 108 W/cm$^2$) is used with a pulse duration of the pulsed laser beam of <150 ns or <30 ns. As a result of the high intensity of the beam, the temperature of the material quickly reaches its vapor temperature and vaporized semiconductor material is ejected from the score as a result of its recoil pressure. Each pulse of the pulsed laser leaves a hole in the semiconductor material and together the holes in the semiconductor material form the required score for cutting through the device.

Another laser based cutting technique is laser melt ejection cutting. This is performed in a single pass of the laser beam over the device surface. This technique uses a lower intensity laser beam, <106 Watt/cm$^2$, but with a much longer pulse duration of between about 5 µs and 50 ms. Instead of being vaporized, the laser beam, together with the long pulses, causes the semiconductor material to melt and the molten material is blown out of the score using a high pressure jet of gas, e.g. using a nozzle diameter <1 mm and a gas pressure of up to 20 bar.

The cross-sectional portion of the device that has been removed in the removing step 104 may have a thickness of from about 0.5 µm to about 3.5 µm, or from about 0.7 µm to about 3.3 µm, or from about 1 µm to about 3 µm, or preferably from about 1.2 µm to about 2.8 µm, or from about 1.5 µm to about 2.5 µm, or from about 1.8 µm to about 2.2 µm.

In some embodiments, where the device cross-section obtained from the removing step 104 is already electron transparent and thus is ready for use. However, if the device cross-section removed during the removing step 104 is not electron transparent, e.g. too thick, at least a portion of the device cross-section may optionally be thinned to be electron transparent. Electron transparency is useful for observation of the cross-sectional portion of the device, particularly for imaging and characterization with a TEM. The portion to be thinned is the area of the device cross-section that is to be viewed, e.g. the area where device degradation and microstructural changes are likely to occur during the reliability test. The device cross-section may be thinned by FIB or ion milling. FIB has been described above. Ion milling may be used to thin samples by firing an ion beam (typically argon) at the surface from an angle and sputtering material from the surface of the device cross-section.

In some embodiments, the device cross-section may be further coated with a coating for protecting the device cross-section. Any surface of the device cross-section that is susceptible to shorting or physical damage may be protected by such a coating. This coating may be made from the same or a different material than that used for making the protection layer. The materials suitable for this coating also include metal oxides or metal hydroxides, as described above. The techniques described above for depositing the protection layer are also suitable for depositing any additional protective coating that may be desired.

In some embodiments, the device is an HEMT, the side of the HEMT cross-section where the semiconductor material layers are exposed may be coated with an additional protective coating. In an exemplary embodiment, the HEMT cross-section will be placed on a holder sideways, thus the holder may provide some protection to at least one surface of the HEMT cross-section.

Referring to FIG. 3, the in situ reliability test method comprises the step of locating the device cross-section in a holder. The holder is used to support the device cross-section during the test and for transmitting a DC bias voltage to the device cross-section through the protruding outreach electrodes. The DC bias voltage supplied from the holder is used to simulate stress conditions that may be encountered in use of the HEMT device in order to induce degradation and structural changes to the device cross-section. The application of sufficient DC bias voltage can be used to accelerate changes that would occur in the device over time in a typical use environment thereby giving an indication of the future performance of the device in a relatively short testing period.

In some embodiments, an electrically conductive epoxy may be used to connect the protruding outreach electrodes to the holder, thus the DC voltage may be transmitted to the device cross-section through the electrically conductive epoxy and the protruding outreach electrodes. Any curable conductive epoxy which adheres to and is compatible with the device cross-section, which has workable cure characteristics (i.e., cure time, cure temperature, etc.) and suitable electrical conductivity may be used. For example, the conductive epoxy may be commercially available silver epoxies, nickel epoxies, chromium epoxies, gold epoxies, tungsten epoxies, alloy epoxies and combinations thereof. Exemplary conductive epoxies are Tra-Duct® 2902 silver epoxy and Applied Technologies 5933 alloy epoxy, which are commercially available from Tra-Con, Inc., and Applied Technologies, respectively.

Referring to FIG. 3, the in situ reliability test comprises the step of transmitting a DC bias voltage from the holder to the device cross-section through the protruding outreach electrodes. The DC bias voltage may be below, at, or above a critical value for the device. The critical voltage values of transistors may be determined by a person skilled in the art as described in the article "Critical Voltage for Electrical Degradation of GaN High-Electron Mobility Transistors," by Joh et al. (*IEEE Electron Device Letters*, Volume 29, pages 287-289, 2008). Multiple DC bias voltages may be transmitted to the cross-section to subject it to different stress conditions. As understood by a person skilled in the art, different devices have different critical voltages. Thus the DC bias voltage that may be used to subject the device cross-section to stress conditions will vary from one type of device to another. In addition, the DC bias voltage may also vary according to the level of stress desired, for example to simulate conditions at different lengths of time for typical use of the device.

In some embodiments, the DC bias voltage supplied to the device cross-section may be any percentage of the critical voltage and may be as low as 5% or 10% of the critical voltage up to the critical voltage or even up to 40% higher than the critical voltage, or from about 40% lower than the critical voltage to about 40% higher than the critical voltage, or from about 30% lower than the critical voltage to about 30% higher than the critical voltage, or from about 28% lower than the critical voltage to about 28% higher than the critical voltage, or from about 25% lower than the critical voltage to about 25% higher than the critical voltage, or from about 20% lower than the critical voltage to about 20% higher than the critical voltage, or from about 15% lower than the critical voltage to about 15% higher than the critical voltage. For example, in one embodiment, the critical voltage for an HEMT is about 40 V. The applied DC bias voltage may be, for example, from about 24 V to about 56 V.

The DC bias voltage may be gradually increased over time and the microstructural changes may be observed during or after the device cross-section is subject to the DC bias voltage. In one embodiment, where microstructural changes are observed during application of the DC bias voltage, the applied voltage may increase at a step size of about 10-500 mV and a current step size of about 1-5 micro amps. In one exemplary embodiment, the DC bias voltage may be supplied by a Keithley Instruments™ model 2400 or 2600 series voltage source. This voltage source allows for precise control over the applied DC voltage with precise voltage step size control.

The time period for subjecting the device cross-section to a stress condition induced by the applied DC bias voltage may be from 3 sseconds to about 200 minutes or from about 1 minute to about 180 minutes, or from about 10 minutes to about 150 minutes or from about 20 minutes to about 120 minutes. The time period required for the test is related to the applied DC voltage. For example, when high DC voltage is applied, the test period will be shorter as failure will occur sooner.

The applied DC bias voltage accelerates the failure mechanisms and induces microstructural changes in the device cross-section. Referring to FIG. 3, the in situ reliability test method comprises the step of observing and quantifying the microstructural changes of the semiconductor device cross-section while still in the holder using a TEM. The types of, and extent of the microstructural changes in the device cross-section will provide an indication of the reliability and life expectancy of the device in actual use during high frequency operation. Therefore, the reliability of the semiconductor device may be evaluated using the method of the invention.

The cross-sectional portion of the device may be observed at the same location where it is subjected to the applied DC bias voltage, since the holder may be located in the TEM as shown in FIGS. 5B and 5C during application of DC bias voltage. Thus, the TEM observation can be carried out in situ to provide real-time information about the microstructural changes and failure mechanisms in the device and the influence of outside forces on the device, as for example would be required to transfer the device cross-section for measurement can be avoided.

Bright field and dark field modes of the TEM may be used to observe the microstructural changes in the device cross-section. Using both bright field and dark field modes may enhance the contrast for nucleating dislocations, cracks and pits in the device cross-section.

In some embodiments, the TEM may take real time images or videos of the microstructural changes as the DC bias voltage is supplied to the device cross-section. In addition, the microstructural changes may be observed along with simultaneous measurement of electrical properties of the device. With both microstructural change data and the electrical properties of the device, the failure mechanism and reasons for unreliability of the device may be revealed. This will permit modeling of the device under stress conditions so that the lifetime of the device can be predicted.

In one embodiment, ex situ TEM may be used to observe the microstructural changes of the device cross-section. In this embodiment, the device cross-section is taken off the holder after being subjected to the DC bias voltage and transferred to a TEM holder, because the holder used may not be suitable to be placed in a TEM. In one embodiment, a portion of the cross-section may be thinned to be electron transparent to observe that portion of the cross-section.

There are other techniques that may also be used to study the device cross-section. For example, scanning transmission electron microscopy/electron energy loss spectroscopy (STEM/EELS) may also be used for analyzing the chemical evolution of the semiconductor layers such as AlGaN layers and the interface with the gate metal and GaN bulk. For example, the formation of metal oxide layers or diffusion of gate metal into the AlGaN layer at the site of a threading dislocations, which are both potentially relevant to prediction of HEMT failure, may be analyzed by STEM/EELS. The formation of threading dislocations may enhance the metal diffusion process. Carrier density evolution can also be investigated using STEM/EELS. Hence, the evolution of electrical properties of HEMTs can be directly correlated to changes in the carrier density as well as the structural evolution.

Another technique that may be used to analyze the cross-sectional portion of the device is a local electrode atom probe (LEAP), which provides atomic resolution for chemical and structural analysis of the HEMT cross-section. LEAP can be used for studying short range diffusion, as all elements can be detected, provided that their charge to mass ratio is not masked by the base material, and the collection efficiency frequently reaches over 50%. For example, the interfacial oxide layer between the gate metal and the AlGaN layer may be studied using this technique.

The present invention also relates to a system for conducting a reliability test on a device with layered structure on a micron-scale and at least two electrodes. The system includes a holder for receiving and holding a cross-sectional portion of the device. A DC bias voltage source is associated with the holder and the holder is provided with structure for electrically connecting the DC bias voltage source to at least two electrodes of a cross-sectional portion of a device located in the holder to form a circuit including the cross-sectional portion of the device. In use, DC bias voltage is transmitted to the cross-sectional portion of the device while located in the holder.

In an advantageous embodiment, the holder is configured for placement in an observation device such as a transmission electron microscope which also forms part of the system to permit observation of the held cross-sectional portion of the device during and/or after application of the DC bias voltage to the device. In this manner, the microstructure of the cross-sectional portion of the device can be directly observed while in the holder to permit real-time in situ measurements. Other devices that may form part of the system include, for example, a scanning transmission electron microscope, a device for conducting electron energy loss spectroscopy and a local electrode atom probe.

In some embodiments, the system also includes structure for measurement of electrical properties, such as characteristic I-V curves, gate leakage current, and drain current of the cross-sectional portion of the device during and/or after application of DC bias voltage. In this manner, the electrical properties of the cross-sectional portion of the device can be correlated with the microstructural changes that are observed to provide additional useful information for evaluation of the device's expected performance over time. Further, microstructural changes can be correlated with changes in the electrical properties of the device in this manner.

EXAMPLES

The following examples are illustrative, but not limiting, of the methods and compositions of the present disclosure. Other suitable modifications and adaptations of the variety of conditions and parameters normally encountered in the field, and which are obvious to those skilled in the art, are within the scope of the disclosure.

Example 1

A HEMT which has a 3-nm GaN cap layer, a 19-nm $Al_{0.28}Ga_{0.72}N$ barrier, an unintentionally doped GaN channel, and a semi-insulating GaN buffer on sapphire substrate was used in this example. The HEMT had a contact resistance of 0.4 Ω/mm and a sheet resistance of 560 Ω/sq, a 2DEG density of $8.5 \times 10^{12}$ cm-2, and a mobility of 1300 cm2/V-s.

Figure 6A:
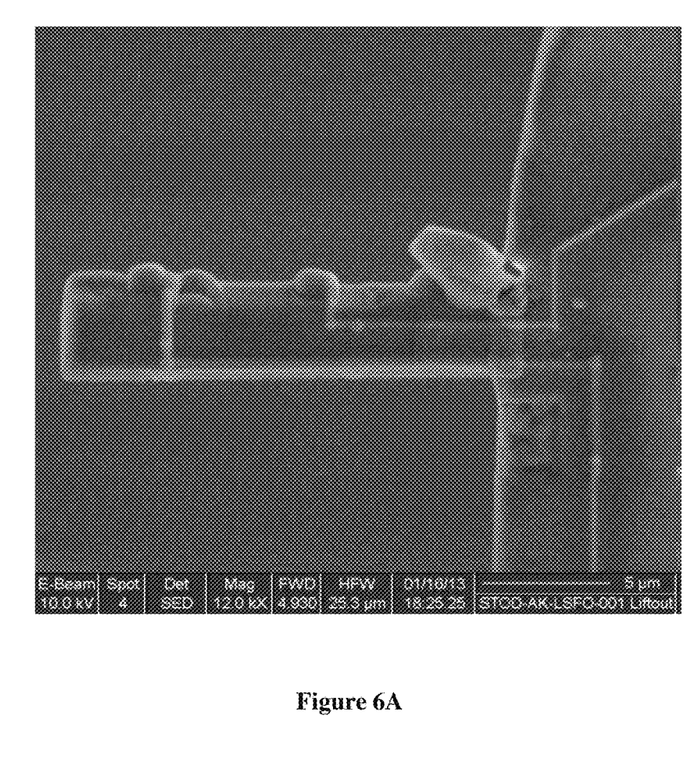
FIGS. 6A-6B show scanning electron microscope (SEM) images of an HEMT with deposited protruding outreach electrodes extended above the MgO protection layer.
Figure 6B:
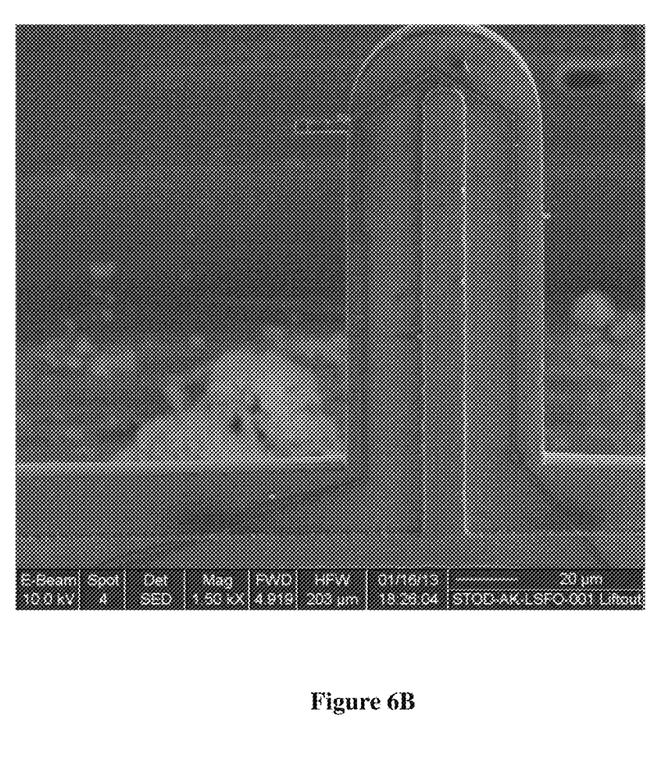
Figure 6C:
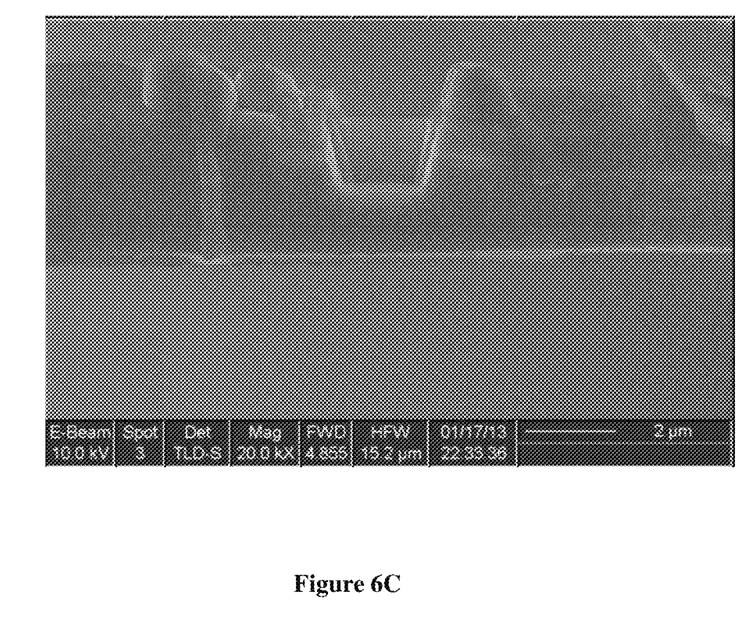
FIG. 6C is an SEM image of an HEMT cross-section with a region of interest thinned to electron transparency.
Figure 6D:
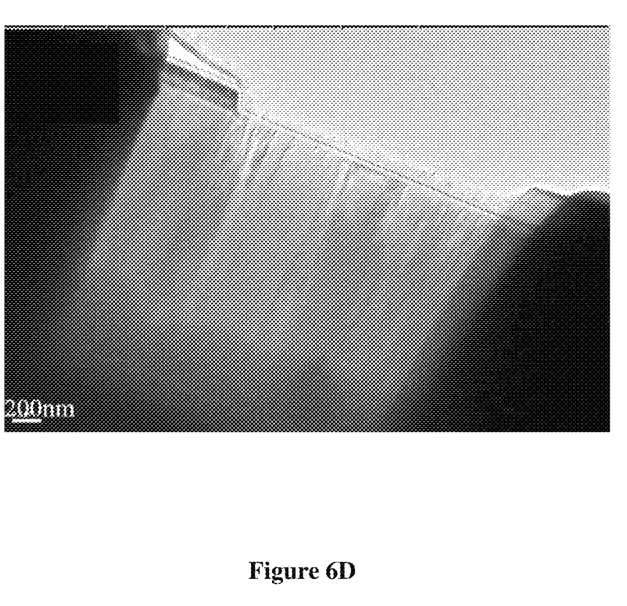
FIG. 6D is a TEM image of the electron transparent region of FIG. 6C, which includes a portion of the gate electrode and its adjacent region.

A cross-section with protruding outreach electrodes (G, S, D) was prepared from the HEMT. The protruding outreach electrodes were extended by depositing a material such as W or Pt on the electrodes using an FIB technique as shown in FIG. 6A. The side of the device where the electrodes are located was coated with an MgO protection layer. Material such as W or Pt was used as the deposition material. The protruding electrodes were sufficiently long to extend to the electrodes of the bias holder for the HEMT cross-sectional portion shown in FIG. 6B. A region of interest of the HEMT was thinned to electron transparency using FIB while the rest of the HEMT was not thinned as shown in FIG. 6C. The thinned HEMT cross-sectional portion was lifted out and included a portion of the gate of the adjacent region as shown in FIG. 6D.

Example 2

Figure 7A:
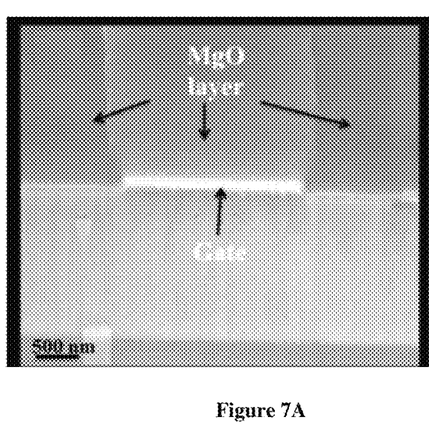
FIG. 7A is an SEM image showing a smooth layer of MgO on top of an HEMT.
Figure 7B:
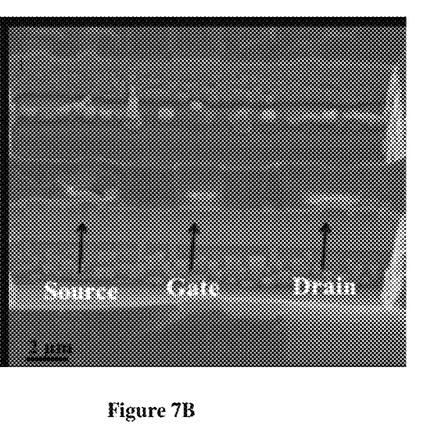
FIG. 7B is an SEM image showing holes drilled into the MgO layer to reach the electrodes of the HEMT.
Figure 7C:
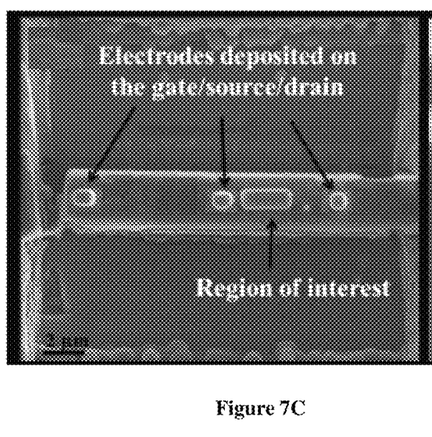
FIG. 7C is an SEM image showing conductive material deposited in the drilled holes of FIG. 7B to form protruding outreach electrodes.
Figure 7D:
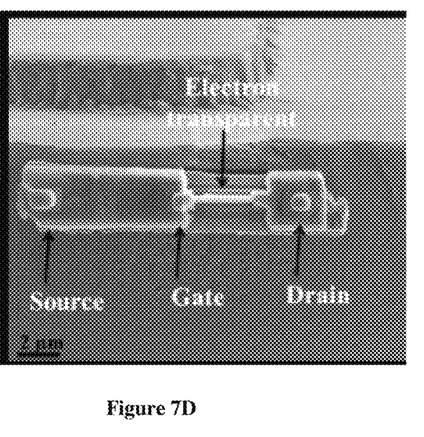
FIG. 7D shows the HEMT of FIG. 7C with a region thinned to electron transparent.

An AlGaN/GaN HEMT was used for stress tests. A protection layer of MgO was deposited on the surface of the HEMT to mask the entire HEMT to prevent it from shorting as shown in FIG. 7A. Three holes were drilled into the MgO protection layer in order to reach the HEMT electrodes as shown in FIG. 7B. The holes were filled with Pt to form the protruding electrodes shown in FIG. 7C. Finally, the area between the middle of the gate and the middle of the drain, as the region of interest, was thinned to electron transparency as shown in FIG. 7D.

It is to be understood, however, that even though numerous characteristics and advantages of the present invention have been set forth in the foregoing description, together with details of the structure and function of the invention, the disclosure is illustrative only, and changes may be made in detail, especially in matters of shape, size and arrangement of parts within the principles of the invention to the full extent indicated by the broad general meaning of the terms in which the appended claims are expressed.

What is claimed is:

1. A method of conducting a reliability test on a device having a layered structure and at least two electrodes the method comprising the steps of:
   locating an electron transparent cross-sectional portion of the device in a holder to form an electrical circuit including the cross-sectional portion of the device via portions of at least two electrodes in the cross-sectional portion of the device;
   transmitting a direct current bias voltage from the holder to the cross-sectional portion of the device via the at least two electrodes of the device; and
   observing and quantifying the microstructural changes of the cross-sectional portion of the device located in the holder
   depositing a protection layer on a surface on the device where the electrodes are located;
   drilling holes through the protection layer to access each of the electrodes;
   depositing a conductive material in the drilled holes to form protruding outreach electrodes for the device; and
   removing an electron transparent cross-sectional portion of an area of interest in the device including at least a portion of two of said electrodes and corresponding protruding outreach electrodes.

2. The method of claim 1, further comprising a step of thinning the cross-sectional portion to be electron transparent prior to locating the cross-sectional portion in the holder.

3. The method of claim 2, wherein the step of thinning is carried out using a focused ion beam or ion milling.

4. The method of claim 1, further comprising a step of electrically connecting the holder to the electrodes of the cross-sectional portion of the device using an electrically conductive epoxy.

5. The method of claim 1, wherein the direct current bias voltage is up to about 40% higher than a critical voltage of the device.

6. The method of claim 1, wherein the direct current bias voltage is transmitted to the cross-sectional portion of the device for a period of from about 3 seconds to about 200 minutes.

7. The method of claim 1, wherein the observing step is carried out simultaneously with the transmitting step.

8. The method of claim 1, wherein the observing step comprises recording of microstructural changes in the cross-sectional portion of the device.

9. The method of claim 1, wherein the step of depositing a protection layer is carried out by vapor deposition.

10. The method of claim 9, wherein the vapor deposition is physical vapor deposition or chemical vapor deposition.

11. The method of claim 1, wherein the protection layer comprises one or more metal oxides, one or more metal hydroxides, or combinations of the two.

12. The method of claim 11, wherein the metal oxide is selected from the group consisting of oxides of silicon, aluminum, zirconium, magnesium, calcium, iron, yttrium, cerium, zinc and combinations thereof.

13. The method of claim 11, wherein the metal hydroxide is selected from the group consisting of hydroxides of silicon, aluminum, zirconium, magnesium, calcium, iron, yttrium, cerium, zinc and combinations thereof.

14. The method of claim 1, wherein the protection layer comprises magnesium oxide.

15. The method of claim 1 wherein the depositing of a conductive material comprises melting the conductive material using a technique selected from the group consisting of laser heating, electron beam heating, focused ion beam heating and electric arc.

16. The method of claim 1, wherein the conductive material is selected from the group consisting of Sn, Y, Ho, Pb, Bi, Li, Al, Ga, Sb, Si, Cd, Mg, Co, Ni, Zr, Hf, Sc, Yb, Lu, Fe, Nb, Ta, W, Te, Au, Pt, Ge and combinations thereof.

17. The method of claim 1, wherein the conductive material is W or Pt.

18. The method of claim 1, wherein the electron transparent cross-sectional portion of the device has a thickness of from about 0.5 μm to about 3.5 μm.

19. The method of claim 1, wherein the device is a high electron mobility transistor.

\* \* \* \* \*